United States Patent
Nakano

(10) Patent No.: US 12,183,749 B2
(45) Date of Patent: Dec. 31, 2024

(54) PHOTOELECTRIC CONVERSION DEVICE AND X-RAY IMAGING DEVICE

(71) Applicant: SHARP KABUSHIKI KAISHA, Sakai (JP)

(72) Inventor: Fumiki Nakano, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 486 days.

(21) Appl. No.: 17/677,303

(22) Filed: Feb. 22, 2022

(65) Prior Publication Data
US 2022/0293648 A1    Sep. 15, 2022

Related U.S. Application Data

(60) Provisional application No. 63/158,551, filed on Mar. 9, 2021.

(51) Int. Cl.
*H01L 27/146*    (2006.01)
*H01L 29/417*    (2006.01)

(52) U.S. Cl.
CPC .. *H01L 27/14603* (2013.01); *H01L 27/14616* (2013.01); *H01L 27/14623* (2013.01); *H01L 27/1463* (2013.01); *H01L 27/14643* (2013.01); *H01L 27/14676* (2013.01); *H01L 29/41733* (2013.01)

(58) Field of Classification Search
CPC ......... H01L 27/14603; H01L 27/14616; H01L 27/14676; H01L 27/14643; H01L 27/14623; H01L 27/1463; H01L 29/41733
See application file for complete search history.

(56) References Cited

U.S. PATENT DOCUMENTS

| | | | |
|---|---|---|---|
| 11,784,202 B2 * | 10/2023 | Lee | H01L 27/14641 257/432 |
| 11,804,503 B2 * | 10/2023 | Misaki | H01L 31/0203 |
| 2015/0041781 A1 | 2/2015 | Hatano et al. | |
| 2016/0233272 A1 | 8/2016 | Hatano et al. | |
| 2017/0040383 A1 | 2/2017 | Hatano et al. | |
| 2017/0323932 A1 | 11/2017 | Hatano et al. | |
| 2018/0277606 A1 | 9/2018 | Hatano et al. | |
| 2021/0408124 A1 | 12/2021 | Hatano et al. | |

FOREIGN PATENT DOCUMENTS

WO    2013/088975 A1    6/2013

* cited by examiner

*Primary Examiner* — Alonzo Chambliss
(74) *Attorney, Agent, or Firm* — ScienBiziP, P.C.

(57) ABSTRACT

A photoelectric conversion device includes a photoelectric conversion area in which photoelectric conversion elements each including a first electrode, a second electrode, and a photoelectric conversion layer, provided between the first electrode and the second electrode, that contains a semiconductor material are provided in a matrix and a guard ring surrounding a periphery of the photoelectric conversion area in a form of a frame. The guard ring has an intermediate layer containing the same semiconductor material as the photoelectric conversion layer.

9 Claims, 13 Drawing Sheets

PHOTOELECTRIC CONVERSION DEVICE AND X-RAY IMAGING DEVICE

CROSS-REFERENCE TO RELATED APPLICATION

The present application claims priority from Provisional Application No. 63/158,551 the content to which is hereby incorporated by reference into this application.

BACKGROUND OF THE INVENTION

1. Field of the Invention

The present disclosure relates to a photoelectric conversion device and an X-ray imaging device.

2. Description of the Related Art

For example, International Publication No. 2013/088975 discloses a solid-state imaging device provided with a guard ring surrounding the periphery of a functional area in which pixels are provided in a matrix. In International Publication No. 2013/088975, the guard ring is formed using a metal layer that is at the same layer as a metal layer used in the pixels. According to International Publication No. 2013/088975, forming the guard ring using the metal layer makes it possible to inhibit moisture or gas from entering the functional area from outside the guard ring.

SUMMARY OF THE INVENTION

Note here that the functional area is surrounded by a frame area provided with routed wires routed using a metal material for electrically connecting the pixels with terminals or other components provided in the frame area. The routed wires are formed using a metal layer that is at the same layer as the metal layer used in the pixels.

The guard ring described in PTL 1 is provided in such a way as to surround the periphery of the functional area. Therefore, for an electrical connection between the pixels in the functional area and the terminals in the frame area through the routed wires, there is a need to cause the routed wires to cross the guard ring in plan view.

However, since the guard ring is formed using the metal layer that is at the same layer as the metal layer used in the pixels, the guard ring is at the same layer as the metal layer used in the routed wires. For this reason, in order to cause the routed wires to cross the guard ring, there is a need to pattern, at a different layer from the metal layer used in the pixels, a metal layer that serves as another new routed wires. This makes it take a lot of trouble to form the routed wires.

To address this problem, an embodiment of the present disclosure has as an object to provide a photoelectric conversion device and an X-ray imaging device that have a structure that makes crossing of a guard ring and a wire easy.

According to an aspect of the present disclosure, there is provided a photoelectric conversion device including: a photoelectric conversion area in which photoelectric conversion elements each including a first electrode, a second electrode, and a photoelectric conversion layer, provided between the first electrode and the second electrode, that contains a semiconductor material are provided in a matrix; and a guard ring surrounding a periphery of the photoelectric conversion area in a form of a frame, wherein the guard ring has an intermediate layer containing the same semiconductor material as the photoelectric conversion layer.

DETAILED DESCRIPTION OF THE INVENTION

Embodiment

Figure 1:
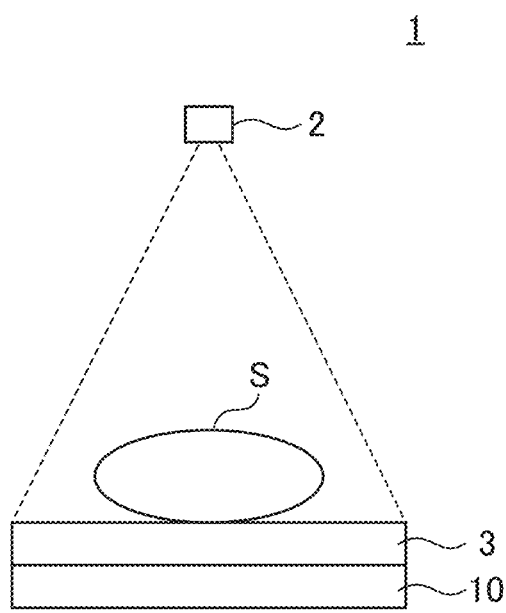
FIG. 1 is a schematic view schematically showing a configuration of an X-ray imaging device according to an embodiment.

FIG. 1 is a schematic view schematically showing a configuration of an X-ray imaging device 1 including a photoelectric conversion device 10 according to an embodiment. The X-ray imaging device 1 takes an image of a subject S with X-rays. The X-ray imaging device 1 is used, for example, in an X-ray fluoroscopic apparatus, an X-ray CT apparatus, or other apparatuses. The X-ray imaging device 1 of the present embodiment has an X-ray source 2, a scintillator 3, and the photoelectric conversion device 10.

The X-ray source 2 irradiates the subject S with X-rays. The X-rays falling on the subject S pass through the subject S and fall on the scintillator 3 provided over the photoelectric conversion device 10. The X-rays falling on the scintillator 3 are converted into fluorescence (hereinafter referred to as "scintillation light") that then falls on the photoelectric conversion device 10. The scintillation light falling on the photoelectric conversion device 10 is converted by the after-mentioned photoelectric conversion element 40 provided in the photoelectric conversion device 10 into electric charge corresponding to the amount of light, and is read out as an electrical signal. Then, the photoelectric conversion device 10 generates an X-ray image on the basis of the electrical signal.

Figure 2:
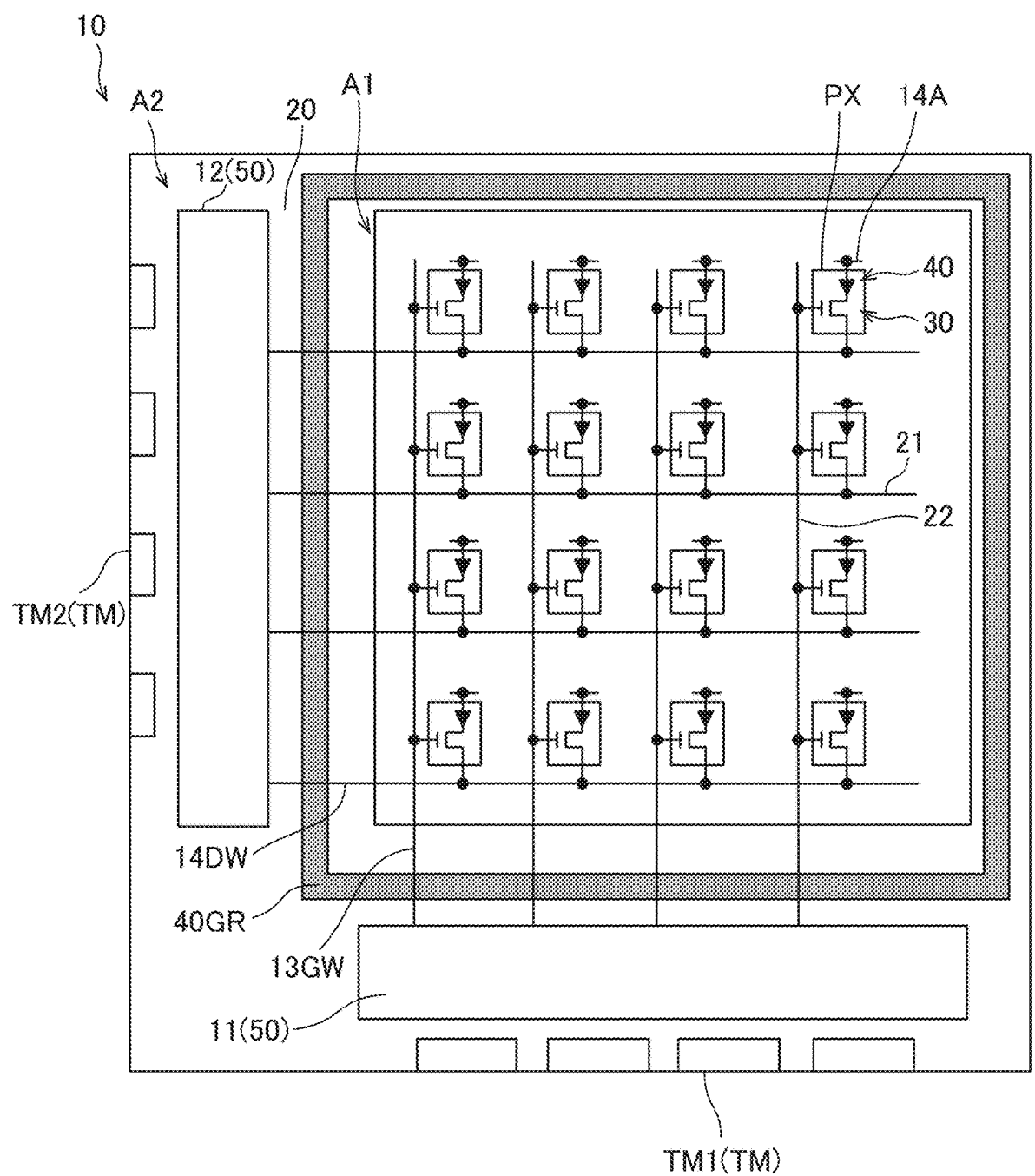
FIG. 2 is plan view schematically representing a configuration of a photoelectric conversion device according to the embodiment.

FIG. 2 is plan view schematically representing a configuration of the photoelectric conversion device 10 according to the embodiment. The photoelectric conversion device 10 includes a substrate 20, a gate wire (wire) 13GW, a data wire 14DW, a bias wire 14A, a pixel PX, a guard ring 40GR, a terminal TM, or other components provided on the substrate 20. The pixel PX includes a TFT 30 and a photoelectric conversion element 40. Further, the photoelectric conversion device 10 has a control section 50.

The control section 50 controls operation of each of the components of the photoelectric conversion device 10. The control section 50 includes a driver connected to the TFTs (thin-film transistors) 30 and the photoelectric conversion element 40. The driver includes a signal readout section 12 and a gate control section 11 that are provided on the substrate 20.

The substrate 20 is constituted, for example, by a material such as glass. A central area of the substrate 20 is a photoelectric conversion area A1 in which a plurality of the pixels PX serving as a plurality of imaging elements are provided in a matrix, and a peripheral area of the substrate 20 that surrounds the photoelectric conversion area A1 is a frame area A2. The photoelectric conversion area A1 is an area that takes an image of the subject S.

The frame area A2 is an area in which various types of driving circuit (such as the gate control section 11 and the signal readout section 12) for driving the plurality of pixels PX, various types of wire, the guard ring 40GR, or other components are provided.

Each pixel PX includes a TFT 30 and a photoelectric conversion element 40. That is, a plurality of the TFTs 30 and a plurality of the photoelectric conversion elements 40 are provided in a matrix in the photoelectric conversion area A1.

For example, the photoelectric conversion element 40 has its anode connected to the bias wire 14A, and has its cathode connected to a drain electrode of the TFT 30. The TFT 30 has its drain electrode connected to the cathode of the photoelectric conversion element 40, has its source electrode connected to the data wire 14DW, and has its gate electrode connected to the gate wire 13GW.

A plurality of the gate wires 13GW and a plurality of the data wires 14DW are provided in such a way as to cross each other in the photoelectric conversion area A1. For example, each of the plurality of gate wires 13GW is connected to the gate electrodes of a plurality of the TFTs 30, is extended across the guard ring 40GR in plan view in the frame area A2, and has an end connected to the gate control section 11. Each of the plurality of data wires 14DW is connected to the source electrodes of a plurality of the TFTs 30, is extended across the guard ring 40GR in plan view in the frame area A2, and has an end connected to the signal readout section 12.

For example, the plurality of gate wires 13GW are extended in a first direction (up-down direction as seen from the front of the surface of paper), and the gate control section 11, which is connected to the plurality of gate wires 13GW, is provided along a side of the photoelectric conversion area A1 extended in a second direction (right-left direction as seen from the front of the surface of paper) orthogonal to the first direction. For example, the plurality of data wires 14DW are extended in the second direction (right-left direction as seen from the front of the surface of paper), and the signal readout section 12, which is connected to the plurality of data wires 14DW, is provided along a side of the photoelectric conversion area A1 extended in the first direction orthogonal to the second direction.

The guard ring 40GR is provided in the frame area A2, and is provided in the form of a frame to surround the periphery of the photoelectric conversion area A1. The guard ring 40GR is formed using a material that hardly allows passage of moisture or gas. This allows the guard ring 40GR to inhibit moisture or gas from entering the photoelectric conversion area A1 from outside the guard ring 40GR through a resin layer, stacked on the substrate 20, that allows easier entry of moisture and gas than an inorganic insulating layer.

A plurality of the terminals TM are provided along ends of the substrate 20 in the frame area A2, and are electrically connected to a plurality of terminals or other components of an external driving circuit (not illustrated). The plurality of terminals TM include a plurality of terminals TM1 and a plurality of terminals TM2 that are placed side by side along ends of the substrate 20 that are different from each other. For example, in the example shown in FIG. 2, the plurality of terminals TM1 are placed side by side in the second direction (right-left direction as seen from the front of the surface of paper) along an end extended along the gate control section 11. Further, in the example shown in FIG. 2, the plurality of terminals TM2 are placed side by side in the first direction (up-down direction as seen from the front of the surface of paper) along an end extended along the signal readout section 12.

Figure 3:
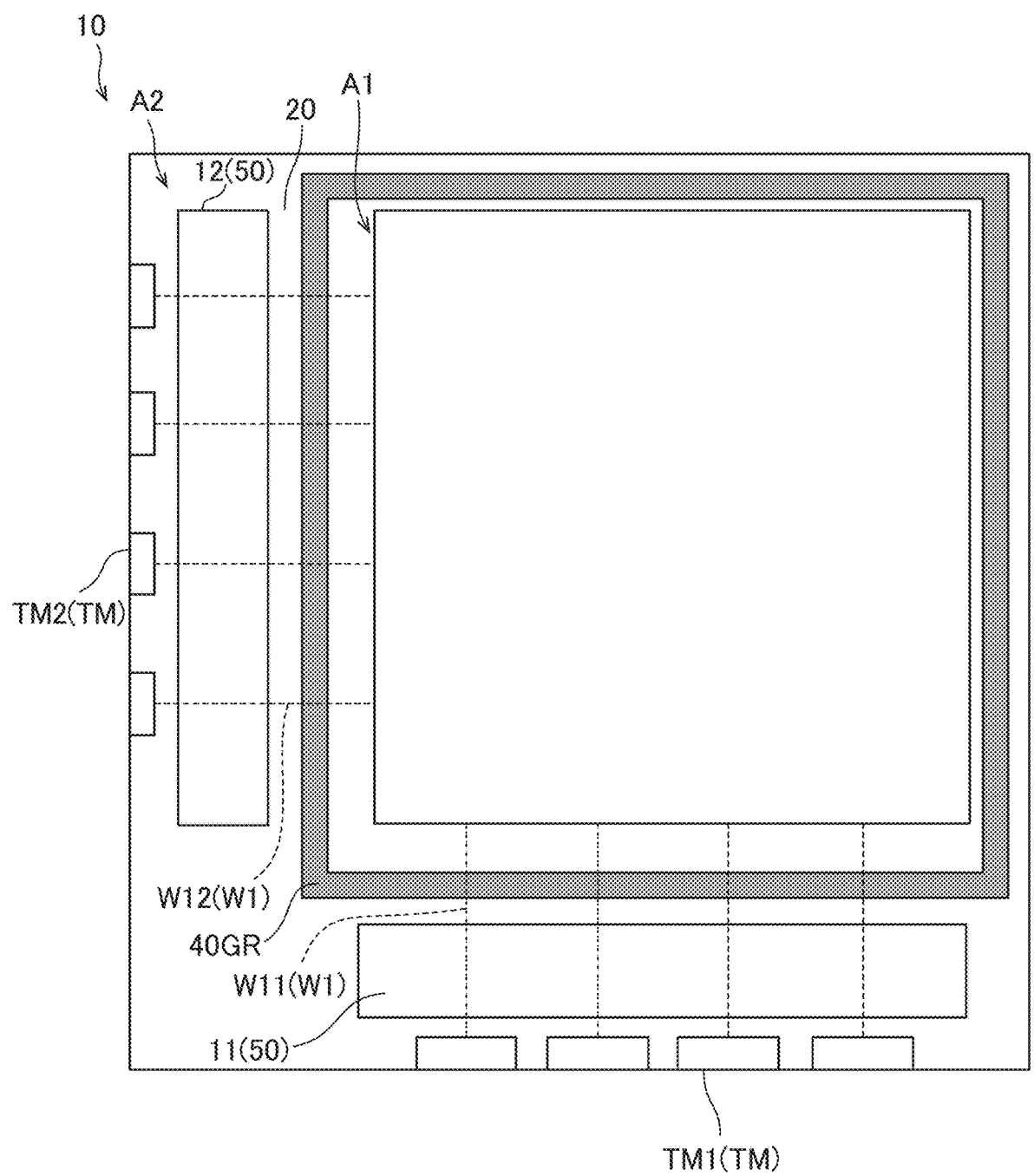
FIG. 3 is a diagram representing the appearance of a routed wire (wire) in the photoelectric conversion device according to the embodiment.

FIG. 3 is a diagram representing the appearance of a routed wire (wire) W1 in the photoelectric conversion device 10 according to the embodiment.

Each of a plurality of the routed wires W1 has its first end connected provided in the photoelectric conversion area A1, and has its second end connected to a corresponding one of the plurality of terminals TM. For example, the plurality of routed wires W1 include a routed wire W11 having its second end connected to a terminal TM1 and a routed wire W12 having its second end connected to a terminal TM2.

The routed wire W1 has its first end provided in the photoelectric conversion area A1 and electrically connected to any of electrodes (e.g. the gate electrode, the source electrode, or the drain electrode) constituting the TFT 30, electrodes (e.g. a first electrode 41 or a second electrode 43) constituting the photoelectric conversion element 40, or various types of wire (e.g. the gate wire 13GW, the data wire 14DW, or the bias wire 14A) in the photoelectric conversion area A1.

For example, each of the plurality of routed wires W1 is formed at the same layer using the same material as a metal layer (e.g. the gate electrode, the source electrode, or the drain electrode) constituting the TFT 30 (as will be described in detail later with reference to FIGS. 7 and 8 or other drawings). The plurality of routed wires W1 each extend from the first end to the second end in such a way as to cross the guard ring 40GR in plan view.

For example, each of a plurality of the routed wires W11 has its first end provided in the photoelectric conversion area A1, has its second end connected to a terminal TM1, crosses the guard ring 40GR in plan view from the first end to the second end, and is extended in the first direction (up-down direction as seen from the front of the surface of paper in FIG. 3).

For example, each of a plurality of the routed wires W12 has its first end provided in the photoelectric conversion area A1, has its second end connected to a terminal TM2, crosses the guard ring 40GR from the first end to the second end, and is extended in the second direction (right-left direction as seen from the front of the surface of paper in FIG. 3).

In the present embodiment, in order to make it easy for a wire, such as the gate wire 13GW and the routed wire W1, formed at the same layer using the same material as a metal layer (e.g. the gate electrode, the source electrodes, and the drain electrodes) used in the formation of, particularly, the TFT 30 in the pixel PX and the guard ring 40GR to cross each other in plan view, the guard ring 40GR has an intermediate layer, formed at a different layer from the metal layer used in the formation of the TFT 30, that contains the same semiconductor material as a photoelectric conversion layer included in the photoelectric conversion element 40. It should be noted that the guard ring 40GR will be described in detail later with reference to FIG. 7 or other drawings.

As shown in FIGS. 1 and 2, upon irradiation with X-rays from the X-ray source 2, the control section 50 applies a predetermined voltage (bias voltage) to the bias wire 14A. The X-rays from the X-ray source 2 pass through the subject S and fall on the scintillator 3. The X-rays falling on the scintillator 3 are converted into scintillation light that then falls on the photoelectric conversion device 10. The scintillation light falling on the photoelectric conversion device 10 is converted by the photoelectric conversion element 40 into electric charge corresponding to the amount of light. A signal corresponding to the electric charge generated by the photoelectric conversion element 40 is read out by the signal readout section 12 through the data wire 14DW when the TFT 30 is in an ON state in response to a gate voltage outputted from the gate control section 11 via the gate wire 13GW. Then, the control section 50 generates an X-ray image corresponding to the signal thus read out.

Figure 4:
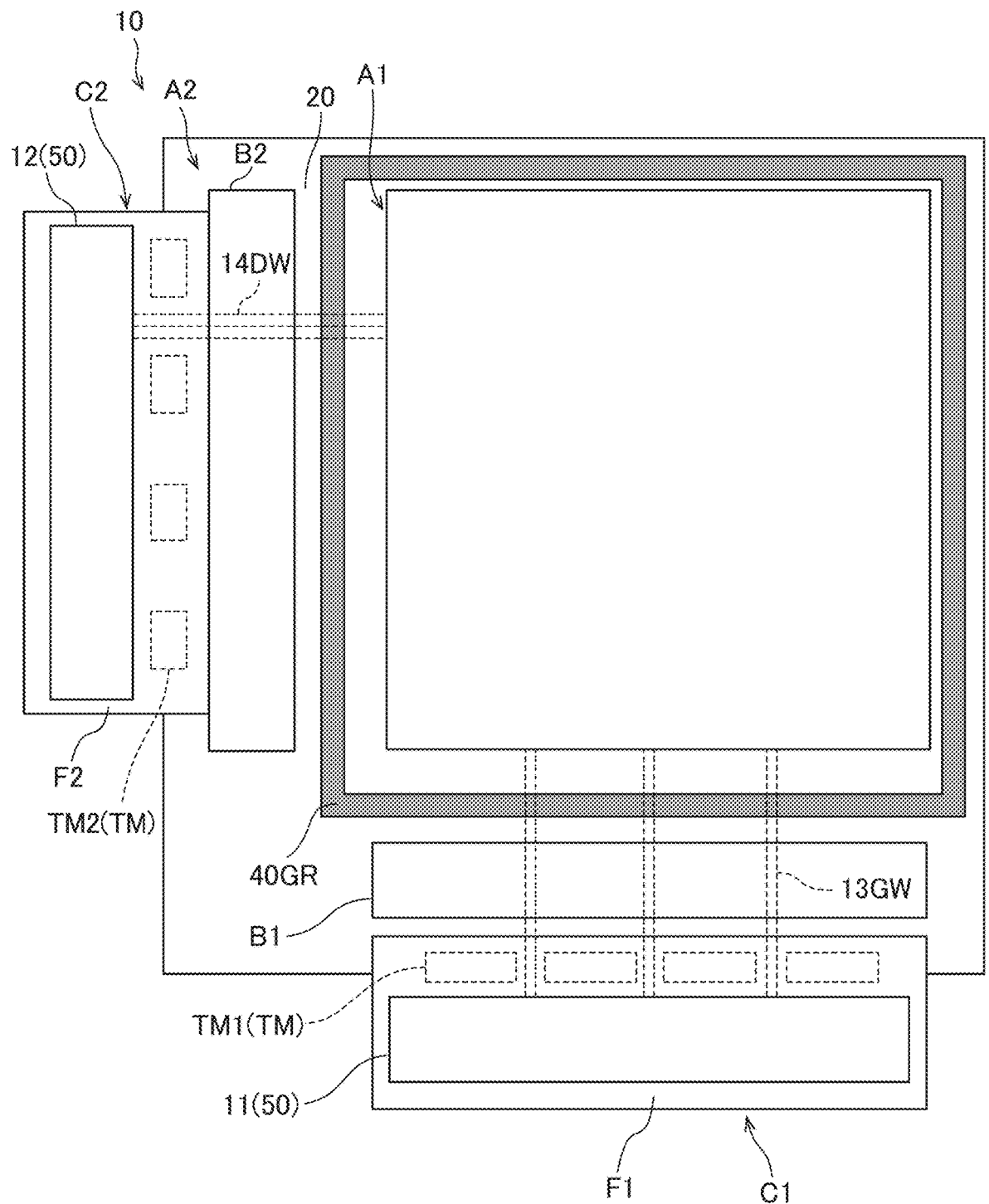
FIG. 4 is a plan view schematically showing a configuration of a photoelectric conversion device according to Modification 1 of the embodiment.

FIG. 4 is a plan view schematically showing a configuration of a photoelectric conversion device 10 according to Modification 1 of the embodiment. As shown in FIG. 4, the photoelectric conversion device 10 may be a so-called COF (chip-on-film) structure in which the controller 50 is provided not on a glass substrate but on a film. In the example shown in FIG. 4, the photoelectric conversion device 10 has a first circuit board C1 obtained by mounting the gate control section 11 on a first film F1 and a second circuit board C2 obtained by mounting the signal readout section 12 on a second film F2.

The first film F1 and the second film F2 are for example flexible films containing resin materials such as polyimide. The gate control section 11 is electrically connected via the first film F1 to a plurality of the gate wires 13GW routed in the frame area A2. The signal readout section 12 is electrically connected via the second film F2 to a plurality of the data wires 14DW routed in the frame area A2. The first film F1 may be electrically connected to the plurality of terminals TM1. Further, the second film F2 may be electrically connected to the plurality of terminals TM2.

Further, as shown in FIG. 4, for example, the photoelectric conversion device 10 may have a first protection circuit section B1 and a second protection circuit section B2 in each of which protection circuit elements are provided in an array. The first protection circuit section B1 is provided, for example, between the first circuit board C1 and the photoelectric conversion area A1. The second protection circuit section B2 is provided, for example, between the second circuit board C2 and the photoelectric conversion area A1.

Figure 5:
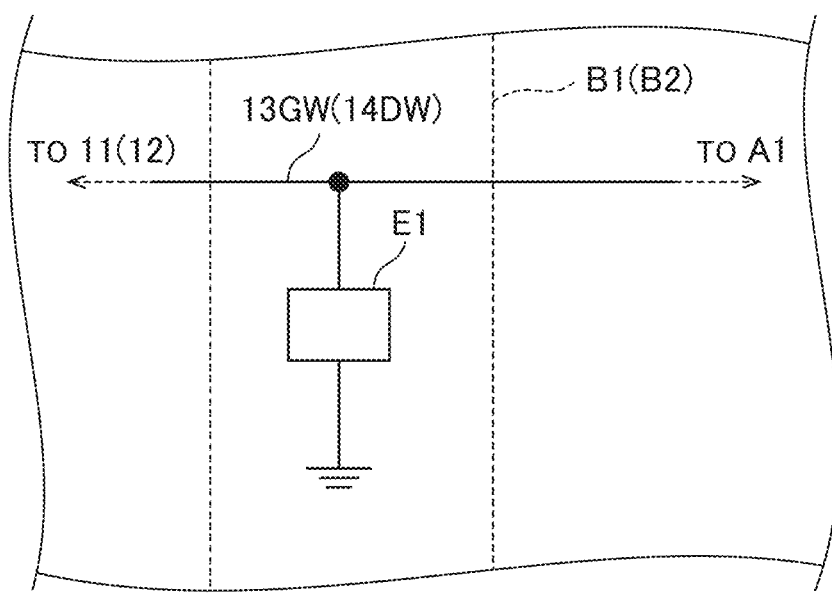
FIG. 5 is a diagram showing an example of a configuration of a protection circuit element provided in each of first and second protection circuit sections shown in FIG. 4.

FIG. 5 is a diagram showing an example of a configuration of a protection circuit element provided in each of the first and second protection circuit sections B1 and B2 shown in FIG. 4. As shown in FIG. 5, a plurality of protection circuit elements $\mu l$ are provided in each of the first and second protection circuit sections B1 and B2.

In the first protection circuit section B1, each of the protection circuit elements $\mu l$ for example has its first end connected to a gate wire 13GW extending from the gate control section 11 to the photoelectric conversion area A1, and has its second end connected to a ground (GND) terminal having a reference potential. This allows the protection circuit element $\mu l$ to inhibit a large voltage generated, for example, by static electricity from flowing to the gate wire 13GW.

Further, in the second protection circuit section B2, each of the protection circuit elements $\mu l$ for example has its first end connected to a data wire 14DW extending from the signal readout section 12 to the photoelectric conversion area A1, and has its second end connected to a ground (GND) terminal having a reference potential. This allows the protection circuit element $\mu l$ to inhibit a large voltage generated, for example, by static electricity from flowing to the data wire 14DW.

It should be noted that each of the plurality of protection circuit elements $\mu l$ may be provided in such a way as to be electrically connected to a corresponding one of the routed wires W1 (see FIG. 3) routed in the frame area A2.

Figure 6:
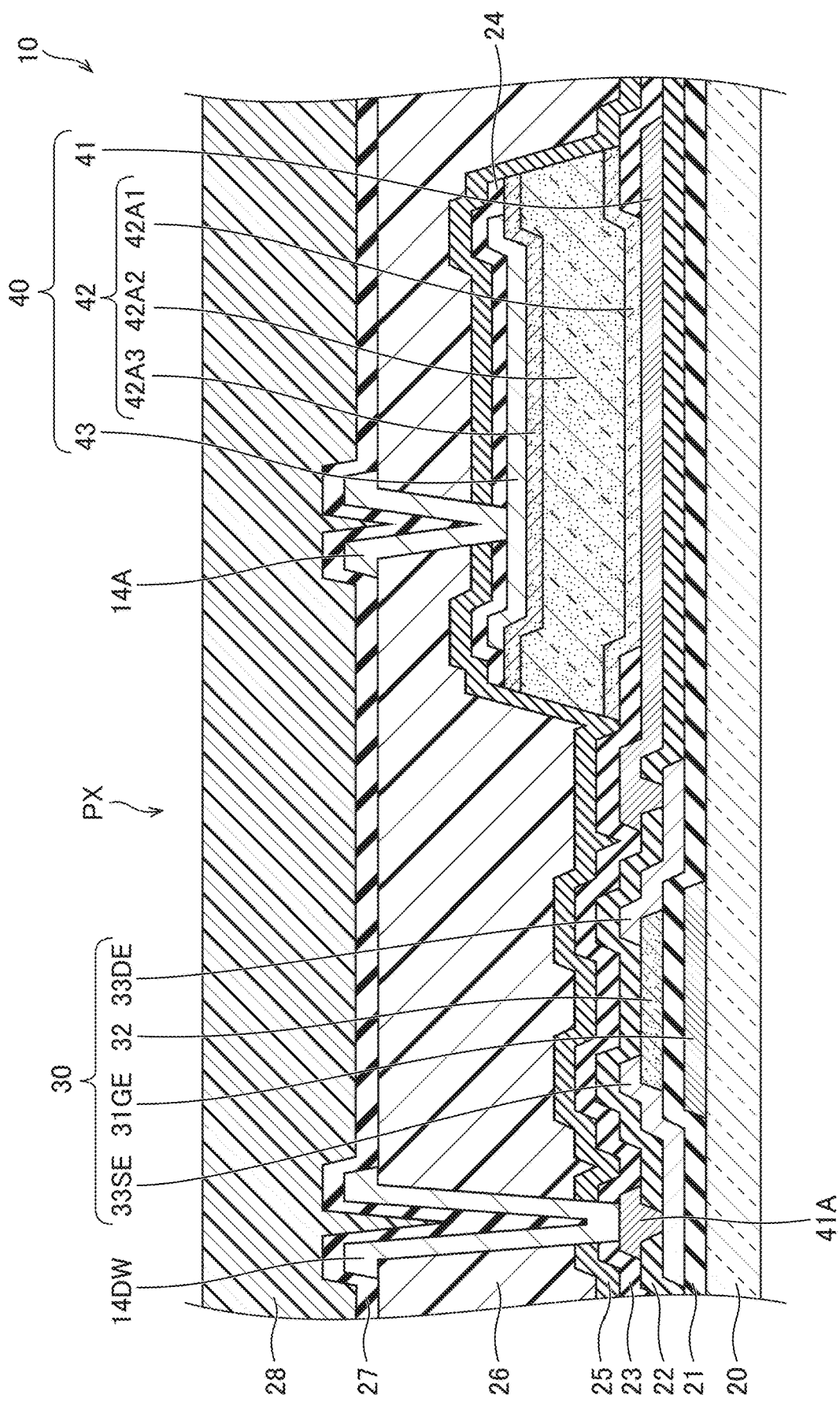
FIG. 6 is a cross-sectional view schematically representing a configuration of a pixel in the photoelectric conversion device according to the embodiment.

FIG. 6 is a cross-sectional view schematically representing a configuration of the pixel PX in the photoelectric conversion device 10 according to the embodiment. The TFT 30 includes a gate electrode 31GE, a semiconductor layer 32, a source electrode 33SE, and a drain electrode 33DE. The gate electrode 31GE, the source electrode 33SE, and the drain electrode 33DE are each a metal layer used in the formation of the TFT 30.

The gate electrode 31GE and the gate wire 13GW (see FIG. 2) are provided over the substrate 20. The gate electrode 31GE is electrically connected to the gate wire 13GW. For example, the gate electrode 31GE and the gate wire 13GW are formed at the same layer in the same step using the same material as each other.

The gate electrode 31GE and the gate wire 13GW are for example each configured such that a metal layer containing tantalum nitride (TaN) is stacked as a lower layer and a metal film containing tungsten (W) is stacked as an upper layer. Alternatively, the gate electrode 31GE and the gate wire 13GW may for example be each configured such that a metal layer containing titanium (Ti) is stacked as a lower layer and a metal film containing copper (Cu) is stacked as an upper layer. Alternatively, the gate electrode 31GE and the gate wire 13GW may for example be each configured such that a metal layer containing aluminum (Al) is stacked as a lower layer and a metal film containing molybdenum nitride (MoN) is stacked as an upper layer. In the present embodiment, the film thickness of the metal layer serving as the lower layer is approximately 300 nm, and the film thickness of the metal layer serving as the upper layer is approximately 30 nm. Note, however, that the materials and film thicknesses of the gate electrode 31GE and the gate wire 13GW are not limited to the foregoing.

A gate insulating layer 21 is provided over the substrate 20, and covers the gate electrode 31GE and the gate wire 13GW (see FIG. 2). The gate insulating layer 21 is constituted, for example, by an inorganic insulating layer containing silicon oxide ($SiO_x$), silicon nitride ($SiN_x$), silicon oxynitride ($SiO_xN_y$) (x>y), silicon nitroxide ($SiN_xO_y$) (x>y), or other materials. The gate insulating layer 21 of the present embodiment is configured such that an inorganic insulating layer containing silicon nitride ($SiN_x$) is stacked as a lower layer and an inorganic insulating layer containing silicon oxide ($SiO_x$) is stacked as an upper layer. In the present embodiment, the film thickness of the inorganic insulating layer serving as the lower layer is approximately 325 nm, and the film thickness of the inorganic insulating layer serving as the upper layer is approximately 10 nm. Note, however, that the materials and film thicknesses of the gate insulating layer 21 are not limited to the foregoing.

The semiconductor layer 32 is provided over the gate insulating layer 21 in such a way as to overlap the gate electrode 31GE via the gate insulating layer 21. For example, the semiconductor layer 32 is constituted by an oxide semiconductor. Usable examples of the oxide semiconductor include $InGaO_3(ZnO)_5$, magnesium zinc oxide ($Mg_xZn_yO$), cadmium zinc oxide ($Cd_xZn_yO$), cadmium oxide (CdO), and an amorphous oxide semiconductor containing predetermined proportions of indium (In), gallium (Ga), and zinc (Zn). The semiconductor layer 32 of the present embodiment is configured such that an oxide semiconductor film containing an amorphous oxide semiconductor containing predetermined proportions of indium (In), gallium (Ga), and zinc (Zn) is stacked as a lower layer and an amorphous oxide semiconductor film containing predetermined proportions of indium (In), gallium (Ga), and zinc (Zn) is stacked as an upper layer. In the present embodiment, the film thickness of the oxide semiconductor film serving as the lower layer is approximately 70 nm, and the film thickness of the oxide semiconductor film serving as the upper layer is approximately 25 nm. Note, however, that the materials and film thicknesses of the semiconductor layer 32 are not limited to the foregoing.

The source electrode 33SE and the drain electrode 33DE are formed at the same layer in the same step using the same material as each other. Specifically, the source electrode 33SE and the drain electrode 33DE are provided over the gate insulating layer 21 in such a way as to make contact with parts of the semiconductor layer 32. The source electrode 33SE and the drain electrode 33DE of the present embodiment are each configured, for example, to have a three-layer structure in which a metal film containing titanium (Ti), a metal film containing aluminum (Al), and a metal film containing titanium (Ti) are stacked in this order from the substrate 20 side (lower layer side). In the present embodiment, the film thicknesses of these three layers are approximately 30 nm, approximately 400 nm, and approximately 50 nm in this order from the substrate 20 side. Note, however, that the materials and film thicknesses of the source electrode 33SE and the drain electrode 33DE are not limited to the foregoing.

A first insulating layer 22 is provided over the gate insulating layer 21, and covers the semiconductor layer 32, the source electrode 33SE, and the drain electrode 33DE. The first insulating layer 22 is for example an inorganic insulating layer containing an inorganic insulating material such as silicon oxide ($SiO_x$), silicon nitride ($SiN_x$), silicon oxynitride ($SiO_xN_y$) (x>y), or silicon nitroxide ($SiN_xO_y$) (x>y). The first insulating layer 22 of the present embodiment contains, for example, silicon oxide ($SiO_x$) and has a film thickness of approximately 500 nm. Note, however, that the material and film thickness of the first insulating layer 22 are not limited to the foregoing. The first insulating layer 22 has an opening in an area overlapping the source electrode 33SE in top view, and also has an opening in an area overlapping the drain electrode 33DE in top view.

Thus, the TFT 30 of the present embodiment is of a bottom-gate type having a gate electrode 31GE provided at a layer that is closer to the substrate 20 side (lower layer side) than the semiconductor layer 32. Note, however, the TFT 30 may be of a top-gate type having a gate electrode 31GE provided at a layer that is farther (toward an upper layer side) away from the substrate 20 side than the semiconductor layer 32 or a double-gate type having gate electrodes 31GE at both a layer that is closer to the substrate 20 side (lower layer side) than the semiconductor layer 32 and a layer that is farther (toward an upper layer side) away from the substrate 20 side than the semiconductor layer 32.

It should be noted that the semiconductor layer 32, the source electrode 33SE, and the drain electrode 33DE may be formed at the same layer in the same step using the same semiconductor material as each other. Specifically, the semiconductor layer 32, the source electrode 33SE, and the drain electrode 33DE may for example be formed as a single entity by an identical oxide semiconductor material. In this case, the source electrode 33SE and the drain electrode 33DE are formed by being at least partially subjected to a resistance-lowering process. Thus, the source electrode 33SE and the drain electrode 33DE may be formed as low-resistance semiconductors whose conductivity is higher than that of the semiconductor layer 32.

The photoelectric conversion element 40 is stacked on the substrate 20. The photoelectric conversion element 40 includes a first electrode 41, a second electrode 43, and a photoelectric conversion layer 42, provided between the first electrode 41 and the second electrode 43, that contains a semiconductor material.

The first electrode 41 is provided over the first insulating layer 22, and is electrically connected to the drain electrode 33DE via a contact hole formed in the first insulating layer 22.

Further, a metal layer 41A formed at the same layer over the first insulating layer 22 in the same step using the same material as the first electrode 41. The metal layer 41A is provided so that part of the metal layer 41A overlaps the source electrode 33SE via the first insulating layer 22, and is electrically connected to the source electrode 33SE via a contact hole formed in the first insulating layer 22.

The first electrode 41 and the metal layer 41A are each configured, for example, to have a three-layer structure in which a metal film containing titanium (Ti), a metal film containing aluminum (Al), and a metal film containing titanium (Ti) are stacked in this order from the substrate 20 side (lower layer side). In the present embodiment, the film thicknesses of these three layers are approximately 30 nm, approximately 300 nm, and approximately 100 nm in this order from the substrate 20 side. Note, however, that the materials and film thicknesses of the first electrode 41 and the metal layer 41A are not limited to the foregoing.

A second insulating layer 23 is provided over the first insulating layer 22, and covers the first electrode 41 and the metal layer 41A. The second insulating layer 23 covers ends of the first electrode 41, and has an opening over a central portion of the first electrode 41.

The second insulating layer 23 is for example an inorganic insulating layer containing an inorganic insulating material such as silicon oxide ($SiO_x$), silicon nitride ($SiN_x$), silicon oxynitride ($SiO_xN_y$) (x>y), or silicon nitroxide ($SiN_xO_y$) (x>y). The second insulating layer 23 of the present embodiment contains, for example, silicon nitride ($SiN_x$) and has a film thickness of approximately 300 nm. Note, however, that the material and film thickness of the second insulating layer 23 are not limited to the foregoing. The second insulating layer 23 has an opening in an area overlapping the metal layer 41A in plan view, and also has an opening in an area overlapping the first electrode 41 in plan view.

The photoelectric conversion layer 42 includes an n-type semiconductor layer 42A1, an i-type semiconductor layer 42A2, and a p-type semiconductor layer 42A3, staked in this order from the substrate 20 side, each of which contains a semiconductor material. The n-type semiconductor layer 42A1 is provided over portions of the second insulating layer 23 covering the ends of the first electrode 41 and over the first electrode 41 via the opening of the second insulating layer 23 formed over the central portion of the first electrode 41.

Note here that in a case where the second insulating layer does not cover the ends of the first electrode and the photoelectric conversion layer has its ends in direct contact with an upper surface of the first electrode, the upper surface of the first electrode is etched when the photoelectric conversion layer is patterned by dry etching or other processes, with the result that the upper surface of the first electrode adheres as adherents to side walls of the photoelectric conversion layer. The adherents having thus adhered to the side walls of the photoelectric conversion layer undesirably form a leak path of an electric current, thus inviting an increase in leak current of the photoelectric conversion layer.

Meanwhile, in the photoelectric conversion device 10 according to the present embodiment, the first electrode 41 has its ends covered with the second insulating layer 23. Moreover, the photoelectric conversion layer 42 is electrically connected to the first electrode 41 via the opening of the second insulating layer 23 formed over the central portion of the first electrode 41. That is, the photoelectric conversion layer 42 has its ends provided over the first electrode 41 via the second insulating layer 23.

This makes it possible to, when the first electrode 41 is formed, the second insulating layer 23 is formed, and then the photoelectric conversion layer 42 is patterned, for example, by etching such as dry etching, inhibit the first electrode 41, which is at a lower layer than the photoelectric conversion layer 42, from being etched. This makes it possible to inhibit a leak path from being formed in the photoelectric conversion layer 42 by adherents adhering when the photoelectric conversion layer 42 is patterned. As a result, the photoelectric conversion device 10 makes it possible to obtain a high-definition X-ray image.

The n-type semiconductor layer 42A1 contains amorphous silicon doped, for example, with an n-type impurity such as phosphorus (P). The film thickness of the n-type semiconductor layer 42A1 of the present embodiment is approximately 10 nm. Note, however, that the material and film thickness of the n-type semiconductor layer 42A1 are not limited to the foregoing.

The i-type semiconductor layer 42A2 is provided over the n-type semiconductor layer 42A1, and is in contact with the n-type semiconductor layer 42A1. The i-type semiconductor layer 42A2 contains i-type amorphous silicon. That is, the i-type semiconductor layer 42A2 contains intrinsic amorphous silicon. The film thickness of the i-type semiconductor layer 42A2 of the present embodiment is approximately 1000 nm. Note, however, that the material and film thickness of the i-type semiconductor layer 42A2 are not limited to the foregoing.

The p-type semiconductor layer 42A3 is provided over the i-type semiconductor layer 42A2, and is in contact with the i-type semiconductor layer 42A2. The p-type semiconductor layer 42A3 contains amorphous silicon doped, for example, with a p-type impurity such as boron (B). The film thickness of the p-type semiconductor layer 42A3 of the present embodiment is approximately 10 nm. Note, however, that the material and film thickness of the p-type semiconductor layer 42A3 are not limited to the foregoing.

The second electrode 43 is provided over the p-type semiconductor layer 42A3. The second electrode 43 is formed, for example, by a transparent conductive material such as ITO (indium tin oxide). The film thickness of the second electrode 43 is approximately 50 nm. Note, however, that the material and film thickness of the second electrode 43 are not limited to the foregoing.

A third insulating layer 24 is provided over the photoelectric conversion element 40. The third insulating layer 24 covers the second electrode 43, and is provided over the p-type semiconductor layer 42A3. The third insulating layer 24 is for example an inorganic insulating layer containing an inorganic insulating material such as silicon oxide ($SiO_x$), silicon nitride ($SiN_x$), silicon oxynitride ($SiO_xN_y$) ($x>y$), or silicon nitroxide ($SiN_xO_y$) ($x>y$). The third insulating layer 24 of the present embodiment contains, for example, silicon nitride ($SiN_x$) and has a film thickness of approximately 50 nm. Note, however, that the material and film thickness of the third insulating layer 24 are not limited to the foregoing.

A fourth insulating layer 25 is provided over the second insulating layer 23, and covers the photoelectric conversion element 40 and the third insulating layer 24. The fourth insulating layer 25 is for example an inorganic insulating layer containing an inorganic insulating material such as silicon oxide ($SiO_x$), silicon nitride ($SiN_x$), silicon oxynitride ($SiO_xN_y$) ($x>y$), or silicon nitroxide ($SiN_xO_y$) ($x>y$). The fourth insulating layer 25 of the present embodiment contains, for example, silicon nitride ($SiN_x$) and has a film thickness of approximately 400 nm. Note, however, that the material and film thickness of the fourth insulating layer 25 are not limited to the foregoing.

A fifth insulating layer 26 is provided over the fourth insulating layer 25. The fifth insulating layer 26 is formed, for example, using transparent resin such as acrylic resin, siloxane resin, or polyimide resin. The film thickness of the fifth insulating layer 26 of the present embodiment is approximately 2.5 μm. Note, however, that the material and film thickness of the fifth insulating layer 26 are not limited to the foregoing.

It should be noted that since the fifth insulating layer 26 of the present embodiment is a resin layer formed using a resin material, it can be made greater in film thickness than an inorganic insulating layer formed using an inorganic insulating material. For this reason, the fifth insulating layer 26 also functions as a planarizing layer that covers and thereby planarizes irregularities on the substrate 20 formed by the TFT 30 and the photoelectric conversion element 40. The planarization of the irregularities formed by the TFT 30 and the photoelectric conversion element 40 makes it possible to inhibit the scintillation light from being diffusely reflected due to the irregularities and obtain a photoelectric conversion device 10 that gives a higher-definition X-ray image.

The data wire 14DW and the bias wire 14A are formed at the same layer over the fifth insulating layer 26 in the same step using the same material as each other. The data wire 14DW is electrically connected to the metal layer 41A via a contact hole formed in the fifth insulating layer 26, the fourth insulating layer 25, and the second insulating layer 23. That is, the data wire 14DW is electrically connected to the source electrode 33SE via the metal layer 41A. The bias wire 14A is electrically connected to the second electrode 43 via a contact hole formed in the fifth insulating layer 26, the fourth insulating layer 25, and the third insulating layer 24.

The data wire 14DW and the bias wire 14A are each configured, for example, to have a four-layer structure in which a metal film containing titanium (Ti), a metal film containing aluminum (Al), a metal film containing titanium (Ti), and a transparent conductive layer containing a transparent conductive material such as ITO are stacked in this order from the substrate 20 side (lower layer side). In the present embodiment, the film thicknesses of these four layers are approximately 60 nm, approximately 600 nm, approximately 50 nm, and approximately 100 nm in this order from the substrate 20 side. Note, however, that the materials, film thicknesses, stack structures of the data wire 14DW and the bias wire 14A are not limited to the foregoing.

A sixth insulating layer 27 is provided over the fifth insulating layer 26, and covers the data wire 14DW and the bias wire 14A. The sixth insulating layer 27 is for example an inorganic insulating layer containing an inorganic insulating material such as silicon oxide ($SiO_x$), silicon nitride ($SiN_x$), silicon oxynitride ($SiO_xN_y$) (x>y), or silicon nitroxide ($SiN_xO_y$) (x>y). The sixth insulating layer 27 of the present embodiment contains, for example, silicon nitride ($SiN_x$) and has a film thickness of approximately 450 nm. Note, however, that the material and film thickness of the sixth insulating layer 27 are not limited to the foregoing.

A seventh insulating layer 28 is provided over the sixth insulating layer 27. The seventh insulating layer 28 is formed, for example, using transparent resin such as acrylic resin, siloxane resin, or polyimide resin. The film thickness of the seventh insulating layer 28 of the present embodiment is approximately 3.0 μm. Note, however, that the material and film thickness of the seventh insulating layer 28 are not limited to the foregoing.

It should be noted that since the seventh insulating layer 28 of the present embodiment is a resin layer formed using a resin material, it can be made greater in film thickness than an inorganic insulating layer formed using an inorganic insulating material. For this reason, the seventh insulating layer 28 also functions as a planarizing layer that covers and thereby planarizes irregularities formed by the TFT 30, the photoelectric conversion element 40, the data wire 14DW, the bias wire 14A, or other components. The planarization of the irregularities formed by the TFT 30, the photoelectric conversion element 40, the data wire 14DW, the bias wire 14A, or other components makes it possible to inhibit the scintillation light from being diffusely reflected due to the irregularities and obtain a photoelectric conversion device 10 that gives a higher-definition X-ray image.

That is, in the photoelectric conversion device 10, which is provided with a plurality of resin layers (in the present embodiment, two layers, namely the fifth insulating layer 26 and the seventh insulating layer 28) that can be made greater in film thickness than an inorganic insulating layer, a surface of the photoelectric conversion area A1 can be more planarized than in a configuration provided with no plurality of resin layers. This makes it possible to more inhibit the diffuse reflection of the scintillation light due to the irregularities on the surface of the photoelectric conversion area. Therefore, the photoelectric conversion device 10 makes it possible to photoelectrically convert the scintillation light with high definition through each pixel PX. As a result, the photoelectric conversion device 10 makes it possible to obtain a higher-definition X-ray image.

Figure 7:
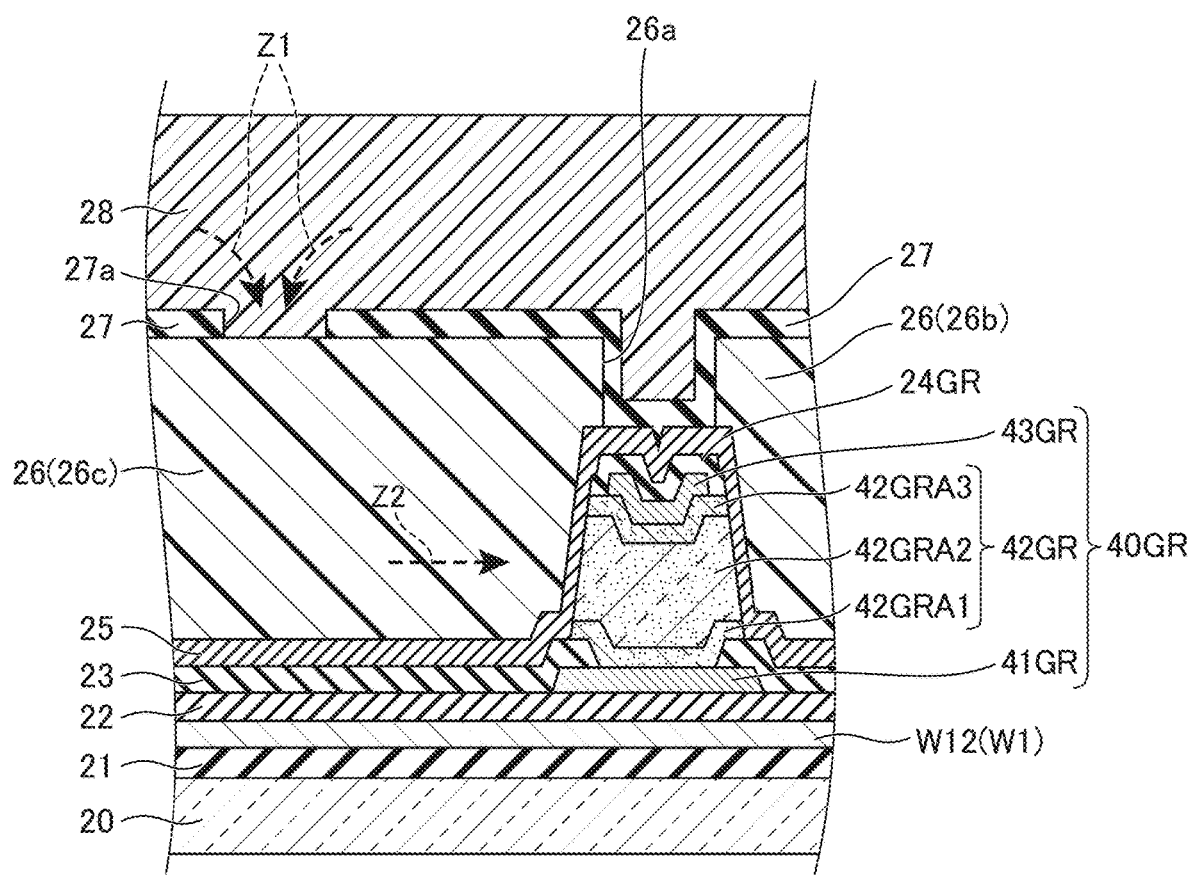
FIG. 7 is a cross-sectional view schematically representing a configuration of components around a guard ring in the photoelectric conversion device according to the embodiment.

FIG. 7 is a cross-sectional view schematically representing a configuration of components around the guard ring 40GR in the photoelectric conversion device 10 according to the embodiment. The configuration of the guard ring 40GR and components around the guard ring 40GR is described with reference to FIGS. 6 and 7.

For example, the guard ring 40GR has a first layer 41GR, an intermediate layer 42GR, and a second layer 43GR that are stacked in this order from a lower layer on the substrate 20 side to an upper layer. The intermediate layer 42GR is provided between the first layer 41GR and the second layer 43GR. The first layer 41GR is at a lower layer than the intermediate layer 42GR, and the second layer 43GR is stacked at a higher layer than the intermediate layer 42GR.

The first layer 41GR is provided over the first insulating layer 22, and contains the same electrical conducting material as the first electrode 41 and the metal layer 41A. That is, the first layer 41GR is formed at the same layer in the same step using the same material as the first electrode 41 and the metal layer 41A. The second insulating layer 23 is provided over the first insulating layer 22, and covers ends of the first layer 41GR.

The intermediate layer 42GR contains the same semiconductor material as the photoelectric conversion layer 42. For example, the intermediate layer 42GR has a first intermediate layer 42GRA1, a second intermediate layer 42GRA2, and a third intermediate layer 42GRA3 that are stacked in this order.

The first intermediate layer 42GRA1 is provided over portions of the second insulating layer 23 covering the ends of the first layer 41GR and over the first layer 41GR. The first intermediate layer 42GRA1 contains the same semiconductor material as the n-type semiconductor layer 42A1 (see FIG. 6). That is, the first intermediate layer 42GRA1 is formed at the same layer in the same step using the same material as the n-type semiconductor layer 42A1 (see FIG. 6).

The second intermediate layer 42GRA2 is provided over the first intermediate layer 42GRA1. The second intermediate layer 42GRA2 contains the same semiconductor material as the i-type semiconductor layer 42A2 (see FIG. 6). That is, the second intermediate layer 42GRA2 is formed at the same layer in the same step using the same material as the i-type semiconductor layer 42A2.

The third intermediate layer 42GRA3 is provided over the second intermediate layer 42GRA2. The third intermediate layer 42GRA3 contains the same semiconductor material as the p-type semiconductor layer 42A3 (see FIG. 6). That is, the third intermediate layer 42GRA3 is formed at the same layer in the same step using the same material as the p-type semiconductor layer 42A3.

The second layer 43GR is provided over the third intermediate layer 42GRA3, and contains the same electrical conducting material as the second electrode 43 (see FIG. 6). That is, the second layer 43GR is formed at the same layer in the same step using the same material as the second electrode 43. A third insulating layer 24GR is provided over the third intermediate layer 42GRA3, and covers the second layer 43GR. The third insulating layer 24GR is formed at the same layer in the same step using the same material as the third insulating layer 24 (see FIG. 6).

The fourth insulating layer 25 is provided over the second insulating layer 23, and covers the intermediate layer 42GR and the third insulating layer 24GR.

The fifth insulating layer 26 is provided over the fourth insulating layer 25, and has a groove portion 26a, formed in a portion thereof overlapping the guard ring 40GR, that extends along the guard ring 40GR. The groove portion 26a is formed in the shape of a frame along the guard ring 40 GR (see FIG. 3) in plan view. Thus, the fifth insulating layer 26, which is formed using a resin material, is divided by the groove portion 26a and the guard ring 40GR into an inner area 26b surrounded by the guard ring 40GR and an outer area 26c outside the guard ring 40GR. A bottom surface of the interior of the groove portion 26a is a surface of the fourth insulating layer 25.

The sixth insulating layer 27 is provided over the fifth insulating layer 26, and is also provided in the groove portion 26a. That is, the sixth insulating layer 27 is provided in such a way as to cover a surface of the inner area 26b and a surface of the outer area 26c and, furthermore, covers side surfaces of the interior of the groove portion 26a and a portion of the surface of the fourth insulating layer 25 serving as the bottom surface of the interior of the groove portion 26a.

Further, the sixth insulating layer 27 has formed therein an opening 27a through which moisture, gas, or other substances in the fifth insulating layer 26 is let out to the seventh insulating layer 28, which is at a higher layer than the sixth insulating layer 27. The opening 27a is formed on a portion of a surface of the fifth insulating layer 26 serving as a surface of the outer area 26c outside the guard ring 40GR. In other words, the guard ring 40GR is provided inside (closer to the photoelectric conversion area A1 than) the opening 27a formed in the sixth insulating layer 27.

The seventh insulating layer 28 is provided over the sixth insulating layer 27, and is in contact with the surface of the outer area 26c of the fifth insulating layer 26 via the opening 27a formed in the sixth insulating layer 27. Further, the seventh insulating layer 28 is also provided in the groove portion 26. That is, the seventh insulating layer 28, which is formed using a resin material and can therefore be made greater in film thickness than an inorganic insulating layer, can planarize irregularities on a surface of the sixth insulating layer 27 formed by the opening 27a, the groove portion 26a, or other components formed in the sixth insulating layer 27.

As indicated by arrows Z1, for example, moisture or gas may enter the outer area 26c of the fifth insulating layer 26, which is a resin layer, via the opening 27a from within the seventh insulating layer 28, which is a resin layer that allows easier entry of moisture and gas than an inorganic insulating layer, or moisture or gas may enter the outer area 26c of the fifth insulating layer 26, which is a resin layer, in an in-plane direction. However, as indicated by an arrow Z2, providing the guard ring 40GR, which is formed by a material that hardly allows passage of moisture, makes it possible to prevent moisture or gas in the outer area 26C of the fifth insulating layer 26 from entering the inner area 26b of the fifth insulating layer 26 inside the guard ring 40GR.

This makes it possible to prevent moisture or gas from being transmitted to the photoelectric conversion area A1 through the inside of the inner area 26b of the fifth insulating layer 26. This results in making it possible to obtain a highly-reliable photoelectrically-converted signal.

Further, the routed wire W1 is provided in such a way as to cross the guard ring 40GR. The routed wire W1 is provided at a different layer from the guard ring 40GR. As an example, the routed wire W1, particularly the routed wire W12, is described here.

For example, the routed wire W12 contains the same electrical conducting material as the source electrode 33SE (FIG. 6) and the drain electrode 33DE. That is, the routed wire W12 is formed at the same layer in the same step using the same material as the source electrode 33SE (FIG. 6) and the drain electrode 33DE.

Figure 8:
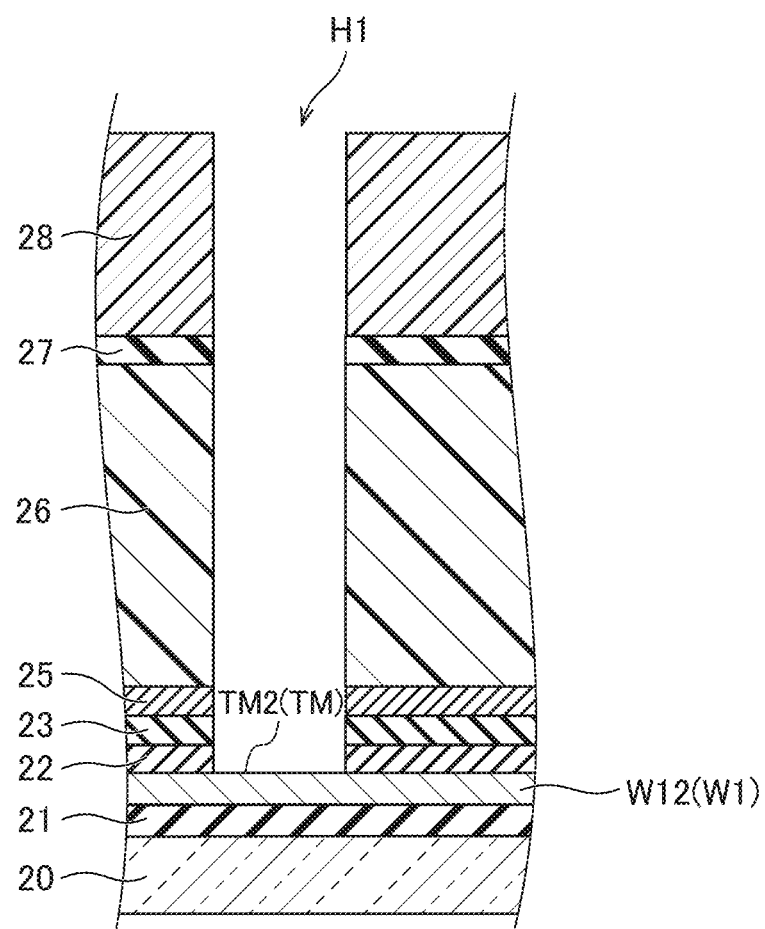
FIG. 8 is a cross-sectional view schematically representing a configuration of components around a terminal in the photoelectric conversion device according to the embodiment.

FIG. 8 is a cross-sectional view schematically representing a configuration of components around a terminal TM2 in the photoelectric conversion device 10 according to the embodiment. The routed wire W12 is described with reference to FIGS. 3 to 8.

The routed wire W12 is provided over the gate insulating layer 21, and is covered with the first insulating layer 22. That is, for example, the routed wire W12 is provided at a lower layer than the guard ring 40GR, passes under the guard ring 40GR, and crosses the guard ring 40GR.

The routed wire W12 has its first end provided in the photoelectric conversion area A1 and electrically connected to any of electrodes (e.g. the gate electrode, the source electrode, or the drain electrode) constituting the TFT 30, electrodes (e.g. the first electrode 41 or the second electrode 43) constituting the photoelectric conversion element 40, or various types of wire (e.g. the gate wire 13GW, the data wire 14DW, or the bias wire 14A) in the photoelectric conversion area A1.

As shown in FIG. 8, the routed wire W12 has its second end connected to the terminal TM2. For example, the terminal TM2 is formed at the same layer in the same step using the same material as the routed wire W12, the source electrode 33SE, and the drain electrode 33DE. The terminal TM2 is provided over the gate insulating layer 21, and has its surface exposed through an opening H1 formed in the first insulating layer 22, the second insulating layer 23, the fourth insulating layer 25, the fifth insulating layer 26, the sixth insulating layer 27, and the seventh insulating layer 28 over the terminal TM2. This configures the terminal TM2 to be able to make an electrical contact with a terminal of an external driving circuit or other devices.

Although not illustrated in cross-section, the routed wire W11 (see FIG. 3) and the plurality of terminals TM1 are for example formed at the same layer in the same step using the same material as the gate electrode 31GE (see FIG. 6). The routed wire W11 is for example formed over the substrate 20, and is covered with the gate insulating layer 21. The plurality of terminals TM1 (see FIG. 3) are for example formed over the substrate 20, and have their surfaces exposed through openings formed in the gate insulating layer 21, the first insulating layer 22, the second insulating layer 23, the fourth insulating layer 25, the fifth insulating layer 26, the sixth insulating layer 27, and the seventh insulating layer 28 over the terminals TM1. This configures the terminals TM1 to be able to make electrical contacts with terminals of an external driving circuit or other devices.

Figure 9:
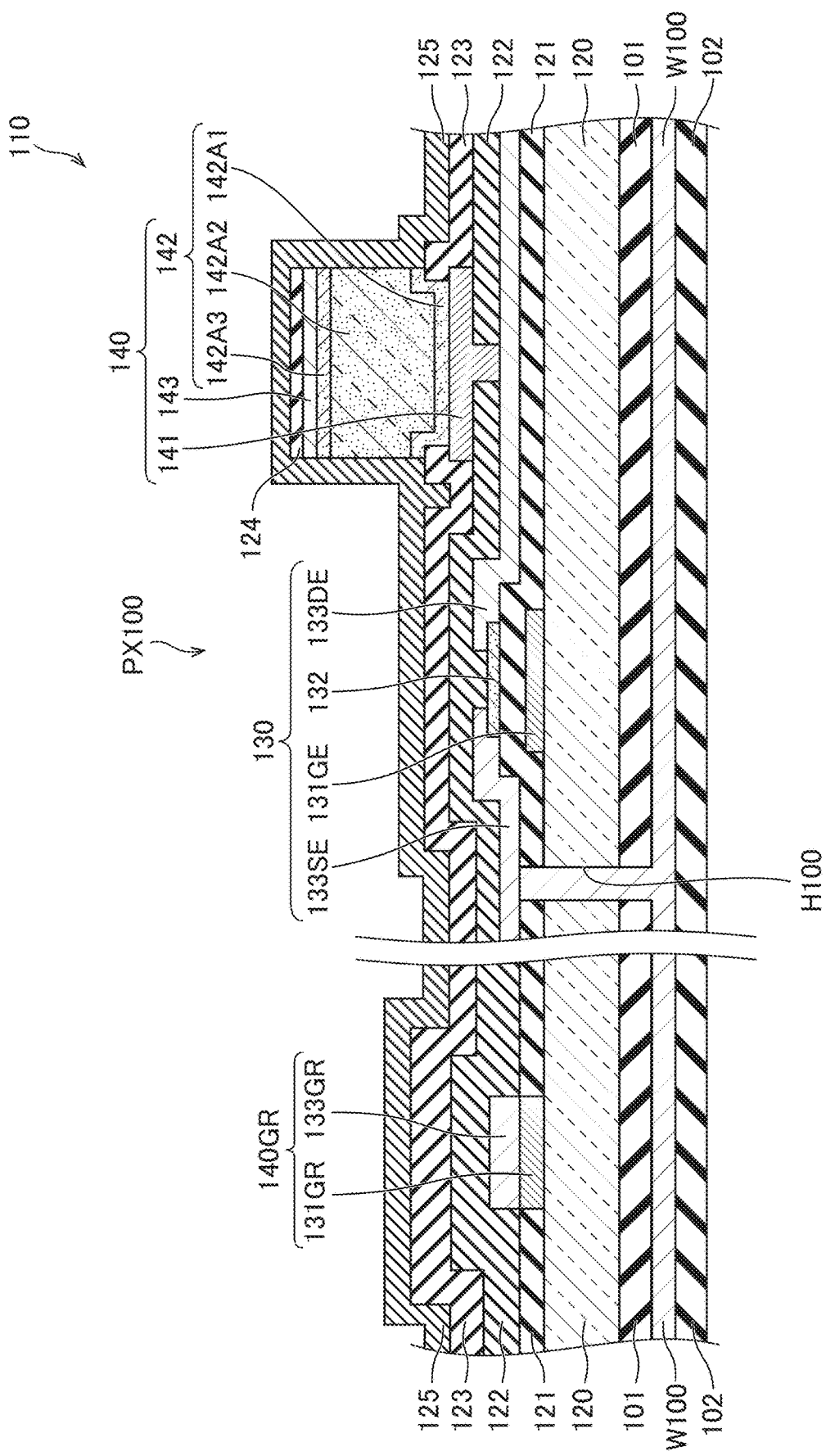
FIG. 9 is a cross-sectional view schematically representing a configuration of a photoelectric conversion device according to a comparative example.

FIG. 9 is a cross-sectional view schematically representing a configuration of a photoelectric conversion device 110 according to a comparative example. The photoelectric conversion device 110 has a plurality of pixels PX100 provided in a photoelectric conversion area.

Each pixel PX100 has a TFT 130 and a photoelectric conversion element 140 that are provided over a substrate 120.

The TFT 130 has a gate electrode 131GE, a source electrode 133SE, and a drain electrode 133DE.

The gate electrode 131GE of the TFT 130 is provided over the substrate 120, and a gate insulating layer 121 is provided over a first surface of the substrate 120, and covers the gate electrode 131GE. A semiconductor layer 132 of the TFT 130 is provided over the gate insulating layer 121, and furthermore, the drain electrode 133DE and source electrode 133SE of the TFT 130 are provided over the gate insulating layer 121 in such a way as to partially overlap the semiconductor layer 132. A first insulating layer 122 is provided over the gate insulating layer 121, and covers the TFT 130.

The photoelectric conversion element 140 has a first electrode 141, a photoelectric conversion layer 142, and a second electrode 143.

The first electrode 141 is provided over the first insulating layer 122, serves as a lower electrode of the photoelectric conversion element 140, and is electrically connected to the drain electrode 133DE via a contact hole formed in the first insulating layer 122. A second insulating layer 123 is provided over the first insulating layer 122, and covers ends of the first electrode 141.

The photoelectric conversion layer 142 is provided over the first electrode 141, and has an n-type semiconductor layer 142A1, an i-type semiconductor layer 142A2, and a p-type semiconductor layer 142A3 that are stacked in this order from a lower layer to an upper layer. The second electrode 143 is provided over the photoelectric conversion layer 142, and serves as an upper electrode. A third insulating layer 124 is provided over the second electrode 143. Moreover, a fourth insulating layer 125 is provided over the second insulating layer 123, and covers the third insulating layer 124 and the photoelectric conversion element 140.

Further, the photoelectric conversion device 110 has a guard ring 140GR provided over the substrate 120 in such a way as to surround the periphery of the photoelectric conversion area. The guard ring 140GR is configured such that a first layer 131GR and a second layer 133GR are stacked in this order over the substrate 120.

The first layer 131GR is formed at the same layer by the same step using the same material as the gate electrode 131GE. The second layer 133GR is formed at the same layer by the same step using the same material as the source electrode 133SE and the drain electrode 133DE.

Thus, in the photoelectric conversion device 110, the first layer 131GR of the guard ring 140GR is formed at the same layer as the gate electrode 131GE, and the second layer 133GR is formed at the same layer as the source electrode 133SE. For this reason, a wire formed at the same layer as the gate electrode 131GE or the source electrode 133SE cannot cross the guard ring 140GR. For this reason, for the formation of a gate wire and a routed wire, there is a need to separately pattern a metal layer at a different layer from the gate electrode 131GE and the source electrode 133SE.

In the photoelectric conversion device 110, a fifth insulating layer 101 is provided on a second surface of the substrate 120 reverse (opposite) to the first surface, and a routed wire W100 is provided over the fifth insulating layer 101 by patterning another metal layer that is different from a metal layer for forming the TFT 130. Moreover, a sixth insulating layer 102 is provided over the fifth insulating layer 105, and covers the routed wire W100.

The routed wire W100 is electrically connected to the source electrode 133SE via a contact hole H100 formed in the fifth insulating layer 101, the substrate 120, and the gate insulating layer 121. Moreover, the routed wire W100 passes under the guard ring 140GR and crosses the guard ring 140GR.

Thus, in the photoelectric conversion device 110, the guard ring 140GR has a first layer 131GR and a second layer 133GR that are formed at the same layer by the same step using the same material as the metal layer used in the TFT 130. For this reason, in order to form the routed wire W100 so that the routed wire W100 crosses the guard ring 140GR, a metal layer that is different from the metal layer used in the TFT 130 needs to be reconnected by being patterned on the second surface of the substrate 120 opposite to the first surface on which the guard ring 140GR is provided. This increases the number of steps and takes a lot of trouble.

Meanwhile, as described with reference to FIGS. 6 and 7, in the photoelectric conversion device 10 according to the present embodiment, the guard ring 40GR that the photoelectric conversion device 10 according to the present embodiment thus includes has the intermediate layer 42GR, which contains the same semiconductor material as the photoelectric conversion layer 42.

This allows the guard ring 40GR to be crossed by a wire (e.g. at least any of the gate wire 13GW (see FIGS. 2 and 4), the data wire 14DW (see FIGS. 2 and 4), the routed wire W11 (see FIG. 3), and the routed wire W12 (see FIGS. 3, 7, and 8)) formed at the same layer by the same step using the same material as a metal layer (i.e. the gate electrode 31GE, the source electrode 33SE, or the drain electrode 33DE) used in the TFT 30 of the pixel PX. This makes it unnecessary to, unlike in the photoelectric conversion device 110 according to the comparative example, reconnect from the metal layer used in the TFT 30 and thereby form a wire so that the wire crosses the guard ring 40GR, and makes it easy to cross the guard ring 40GR. Thus, the photoelectric conversion device 10 has a structure that makes crossing of the guard ring 40GR and a wire (e.g. the gate wire 13GW (see FIG. 2), the routed wire W11 (see FIG. 3), and the routed wire W12 (see FIGS. 3, 7, and 8)) easy. This makes it possible to hold down an increase in the number of steps.

Thus, at least any of the wires (e.g. the gate wire 13GW (see FIG. 2), the data wire 14DW (see FIGS. 2 and 4), the routed wire W11 (see FIG. 3), and the routed wire W12 (see FIGS. 3, 7, and 8)) that the photoelectric conversion device 10 includes extends from the first end to the second end in such a way as to cross the guard ring 40GR. For this reason, even if the guard ring 40GR is provided in such a way as to surround the periphery of the photoelectric conversion area A1, a signal from any of the various types of driving circuit provided in the frame area A2 can be outputted to the pixel PX provided in the photoelectric conversion area A1 via a wire (e.g. any of the gate wire 13GW (see FIG. 2), the data wire 14DW (see FIGS. 2 and 4), the routed wire W11 (see FIG. 3), and the routed wire W12 (see FIGS. 3, 7, and 8)) crossing the guard ring 40GR, or a signal outputted from the pixel PX can be outputted to an external circuit via the wire.

Further, as shown in FIGS. 6 and 7, for example, the guard ring 40GR has, in addition to the intermediate layer 42GR, the first layer 41GR provided at a lower layer than the intermediate layer 42GR and the second layer 43GR provided at a higher layer than the intermediate layer 42GR.

The first layer 41GR is an electrically-conductive layer containing the same electrical conducting material as the first electrode 41, and is therefore a layer that hardly allows passage of moisture or gas. The first layer 41GR is formed at the same layer by the same step using the same material as the first electrode 41.

Further, the second layer 43GR is an electrically-conductive layer containing the same electrical conducting material as the second electrode 43, and is therefore a layer that hardly allows passage of moisture or gas. The second layer 43GR is formed at the same layer by the same step using the same material as the second electrode 43.

Thus, the guard ring 40GR, which has the first layer 41GR and the second layer 43GR in addition to the intermediate layer 42GR, can be made greater in film thickness than a guard ring having only an intermediate layer. This makes it possible to fill in a depression formed by the groove portion 26a and planarize a (photosensitive) surface of the photoelectric conversion device 10 (that receives the scintillation light). This makes it possible to photoelectrically convert the scintillation light with high definition through each pixel PX and obtain a higher-definition X-ray image.

Alternatively, the guard ring 40GR may have only either the first layer 41GR or the second layer 43GR in addition to the intermediate layer 42GR. That is, the guard ring 40GR needs only have at least either the first layer 41GR or the second layer 43GR in addition to the intermediate layer 42GR. This too makes it possible to fill in the depression formed by the groove portion 26a and planarize the (photosensitive) surface of the photoelectric conversion device 10 (that receives the scintillation light). This too makes it possible to photoelectrically convert the scintillation light with high definition through each pixel PX and obtain a higher-definition X-ray image.

The intermediate layer 42GR of the guard ring 40GR is configured such that a first intermediate layer 42GRA1, a second intermediate layer 42GRA2, and a third intermediate layer 42GRA3 are provided in this order from a lower layer to an upper layer.

The first intermediate layer 42GRA1 contains the same semiconductor material as the n-type semiconductor layer 42A1 of the photoelectric conversion layer 42, and is formed at the same layer in the same step as the n-type semiconductor layer 42A1. The second intermediate layer 42GRA2 contains the same semiconductor material as the i-type semiconductor layer 42A2 of the photoelectric conversion layer 42, and is formed at the same layer in the same step as the i-type semiconductor layer 42A2. The third intermediate layer 42GRA3 contains the same semiconductor material as the p-type semiconductor layer 42A3 of the photoelectric conversion layer 42, and is formed at the same layer in the same step as the p-type semiconductor layer 42A3.

This allows the intermediate layer 42GR to be formed by the same step as the photoelectric conversion layer 42. This makes it unnecessary to increase the number of separate steps to form the intermediate layer 42GR, making it possible to inhibit the number of steps from increasing due to the formation of the intermediate layer 42GR.

Figure 10:
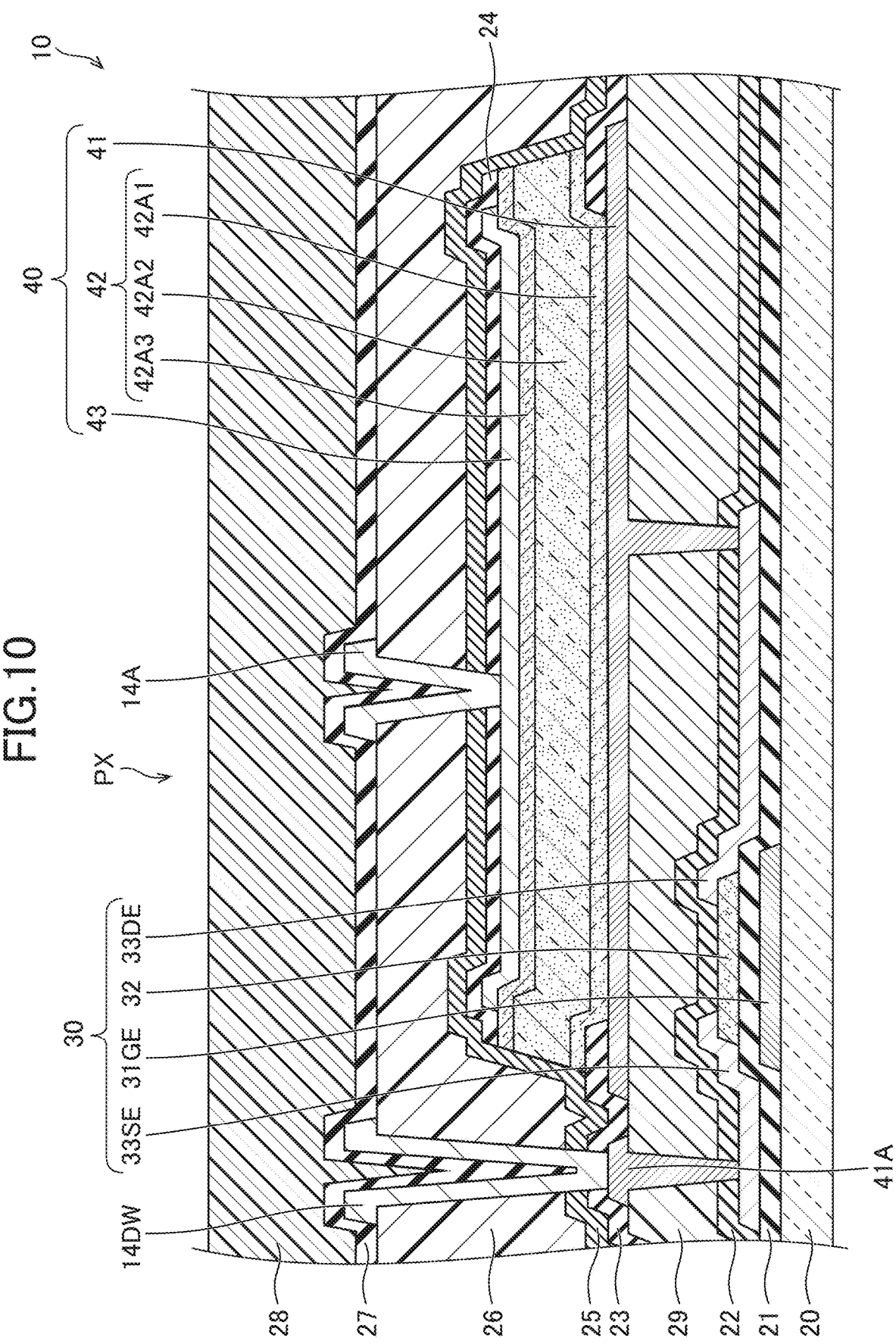
FIG. 10 is a cross-sectional view schematically representing a configuration of a pixel in a photoelectric conversion device according to Modification 2 of the embodiment.

FIG. 10 is a cross-sectional view schematically representing a configuration of a pixel PX in a photoelectric conversion device 10 according to Modification 2 of the embodiment. As shown in FIG. 10, the photoelectric conversion device 10 may include an eighth insulating layer (planarizing layer, resin insulating layer) 29 between the first insulating layer 22 and the second insulating layer 23.

The eighth insulating layer 29 is provided over the first insulating layer 22. Moreover, the eighth insulating layer 29 covers the TFT 30 via the first insulating layer 22, and has formed on a surface thereof the first electrode 41, the metal layer 41A, and the second insulating layer 23, which covers the first electrode 41 and the metal layer 41A.

The first electrode 41 is electrically connected to either the drain electrode 33DE or the source electrode 33SE (in the example shown in FIG. 10, the drain electrode 33DE) via a contact hole formed in the eighth insulating layer 29 and the first insulating layer 22.

The metal layer 41A is electrically connected to either the drain electrode 33DE or the source electrode 33SE (in the example shown in FIG. 10, the source electrode 33SE) via a contact hole formed in the eighth insulating layer 29 and the first insulating layer 22.

The eighth insulating layer 29 is formed, for example, using an insulative resin material containing transparent resin such as acrylic resin, siloxane resin, or polyimide resin. The film thickness of the eighth insulating layer 29 of the present embodiment is approximately 2.5 μm. Note, however, that the material and film thickness of the eighth insulating layer 29 are not limited to the foregoing.

Since the eighth insulating layer 29 is a resin layer formed using a resin material, it can be made greater in film thickness than an inorganic insulating layer formed using an inorganic insulating material. For this reason, the eighth insulating layer 29 can function as a planarizing layer that covers and thereby planarizes irregularities on the substrate 20 formed by the TFT 30.

By thus providing the eighth insulating layer 29, which is formed using a resin material that can be made greater in film thickness than an inorganic insulating layer, between the first electrode 41 and the source electrode 33SE and between the first electrode 41 and the drain electrode 33DE, the photoelectric conversion element 40, which includes the first electrode 41, can be provided so as to overlap the TFT 30 via the eighth insulating layer 29. This makes it possible to make the occupied area of the photoelectric conversion layer 42 per pixel PX larger than in a case where a photoelectric conversion element and a TFT do not overlap each other. This makes it possible to bring about improvement in sensitivity to the scintillation light per pixel PX and obtain a photoelectric conversion device 10 that gives a higher-definition X-ray image.

Figure 11:
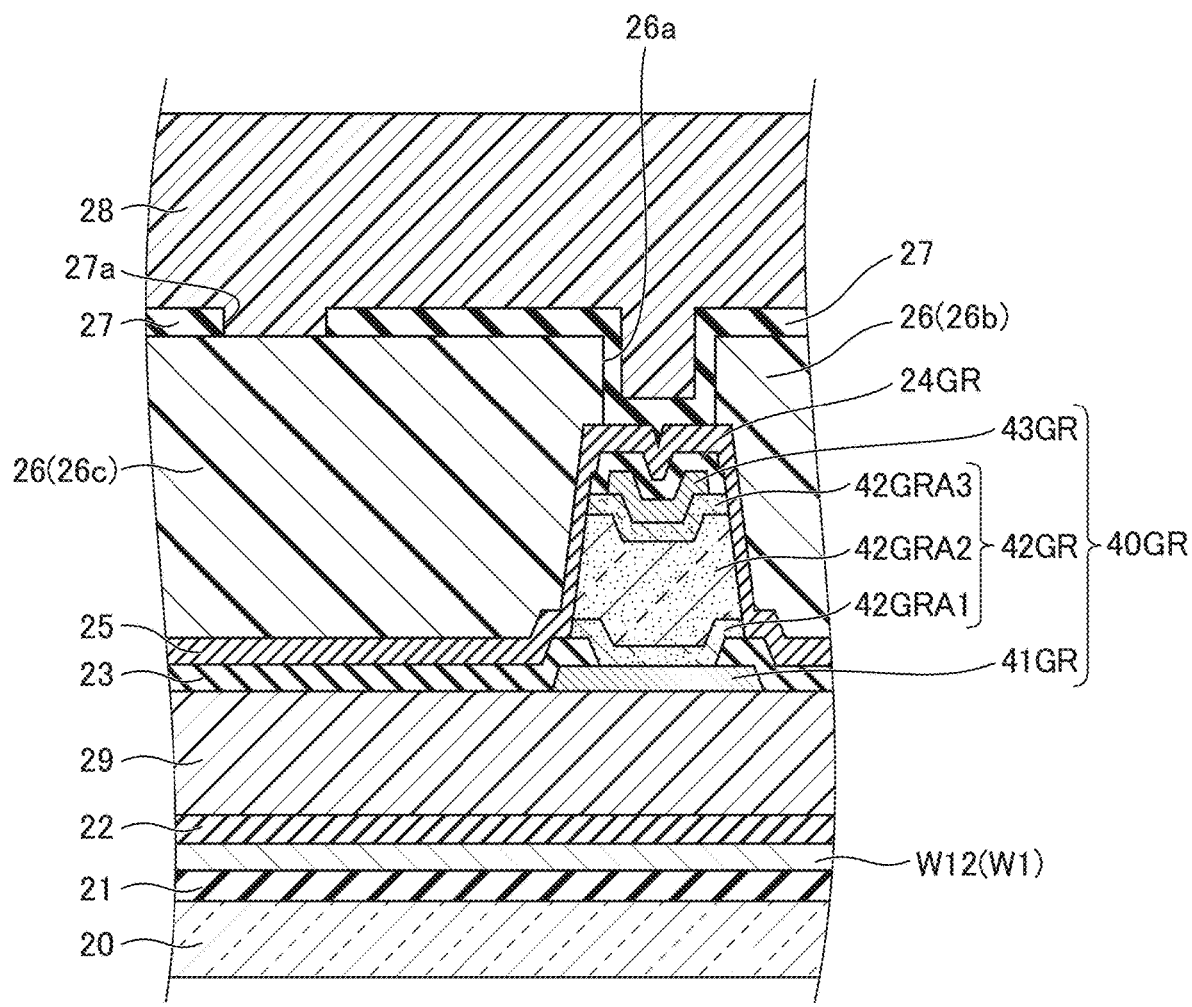
FIG. 11 is a cross-sectional view schematically representing a configuration of components around a guard ring in the photoelectric conversion device according to Modification 2 of the embodiment shown in FIG. 10.

FIG. 11 is a cross-sectional view schematically representing a configuration of components around a guard ring 40GR in the photoelectric conversion device 10 according to Modification 2 of the embodiment shown in FIG. 10. As shown in FIG. 11, in the photoelectric conversion device 10 according to Modification 2, the eighth insulating layer 29 is provided over the first insulating layer 22. Moreover, the first layer 41GR and the second insulating layer 23 are provided over the eighth insulating layer 29. Thus, the eighth insulating layer (resin insulating layer) 29 formed by a resin layer containing an insulative resin material is formed at a crossing of the guard ring 40GR and the routed wire W1 (routed wire W12) and between the guard ring 40GR and the routed wire W1 (routed wire W12). This makes it possible to place the guard ring 40GR and the routed wire W1 (routed wire W12) at a longer distance from each other at the crossing of the guard ring 40GR and the routed wire W1 (routed wire W12) than in a case where no resin layer is provided between the guard ring 40GR and the routed wire W1 (routed wire W12).

That is, providing the eighth insulating layer 29, which contains an insulative resin material than can be made greater in film thickness than an inorganic insulating layer, between the guard ring 40 and the routed wire W1 makes it possible to reduce a capacitance that is formed at the crossing of the guard ring 40 and the routed wire W1 (routed wire W12). This makes it possible to obtain a photoelectric conversion device 10 that is driven at a higher speed and that consumes less electricity.

Figure 12:
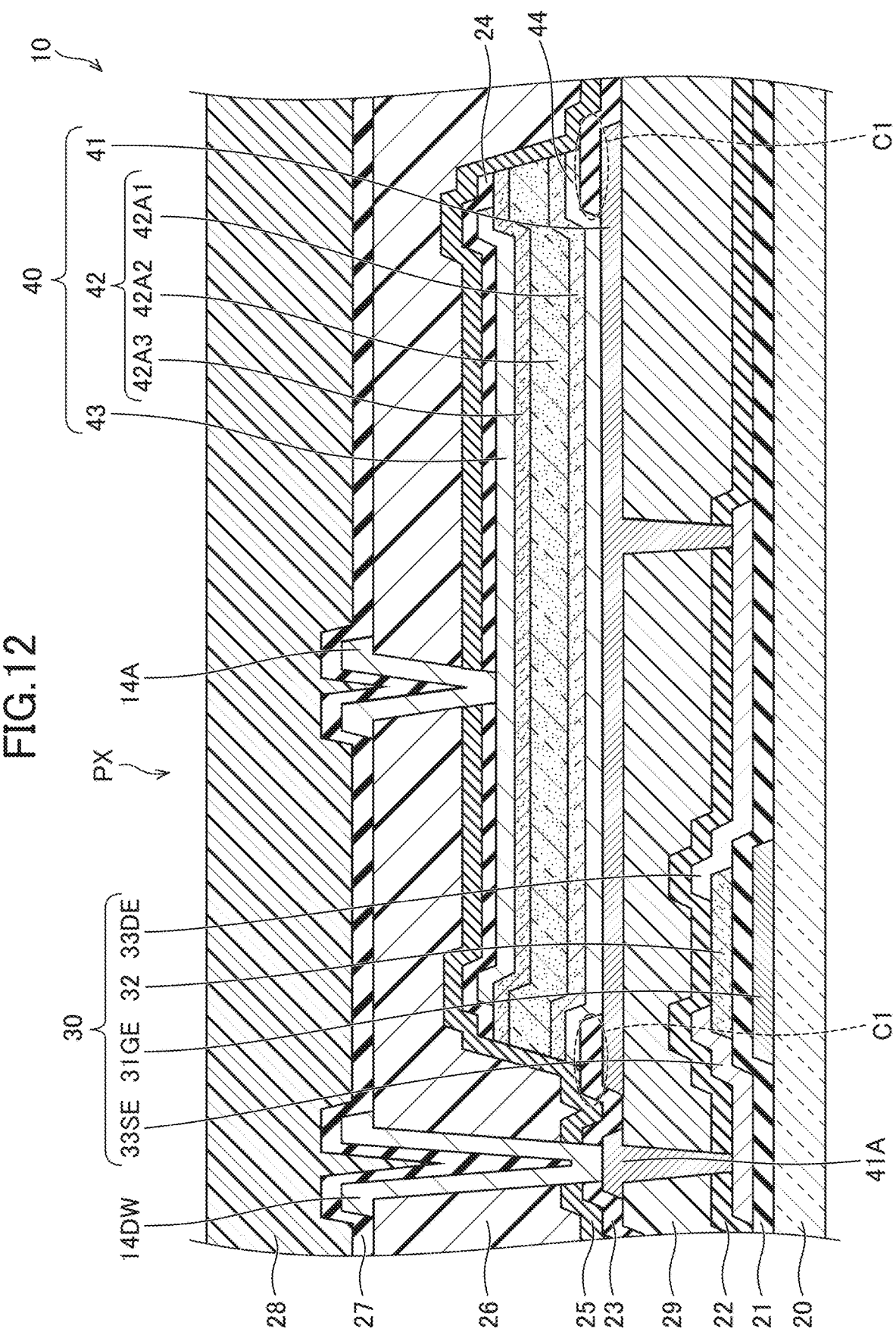
FIG. 12 is a cross-sectional view schematically representing a configuration of a pixel in a photoelectric conversion device according to Modification 3 of the embodiment.

FIG. 12 is a cross-sectional view schematically representing a configuration of a pixel PX in a photoelectric conversion device 10 according to Modification 3 of the embodiment. As shown in FIG. 12, in the photoelectric conversion device 10, an intermediate electrically-conductive layer 44 may be provided between the first electrode 41 and the photoelectric conversion layer 42. The example shown in FIG. 12 is a configuration in which the photoelectric conversion device 10 shown in FIG. 10 is further provided with the intermediate electrically-conductive layer 44. It should be noted that the eighth insulating layer 29 may be omitted from the configuration of the photoelectric conversion device 10.

The intermediate electrically-conductive layer 44 is provided over the first electrode 41 and over the second insulating layer 23 provided over the ends of the first electrode 41. Moreover, the n-type semiconductor layer 42A1 of the photoelectric conversion layer 42 is provided over the intermediate electrically-conductive layer 44. The intermediate electrically-conductive layer 44 contains, for example, titanium (Ti). For example, the film thickness of the intermediate electrically-conductive layer 44 is approximately 30 nm. Note, however, that the material and film thickness of the intermediate electrically-conductive layer 44 are not limited to the foregoing.

Note here that electric charge may accumulate in areas of the second insulating layer 23 (i.e. areas indicated by dashed lines C1 in FIG. 12) provided over the ends of the first electrode 41.

Moreover, as shown in FIG. 12, the intermediate electrically-conductive layer 44 is provided over the first electrode 41 and between the first electrode 41 and the photoelectric conversion layer 42. Moreover, the intermediate electrically-conductive layer 44 is also provided in such a way as to cover the second insulating layer 23 provided over the ends of the first electrode 41. This makes it possible to cause electric charge trying to accumulate in the second insulating layer 23 over the ends of the first electrode 41 to migrate to the photoelectric conversion layer 42 via the intermediate electrically-conductive layer 44 and the first electrode 41. This makes it possible to achieve more efficient photoelectric conversion through the photoelectric conversion layer 42, resulting in making it possible to obtain a photoelectric conversion device 10 that is superior in afterimage characteristics and that gives a higher-definition X-ray image.

Figure 13:
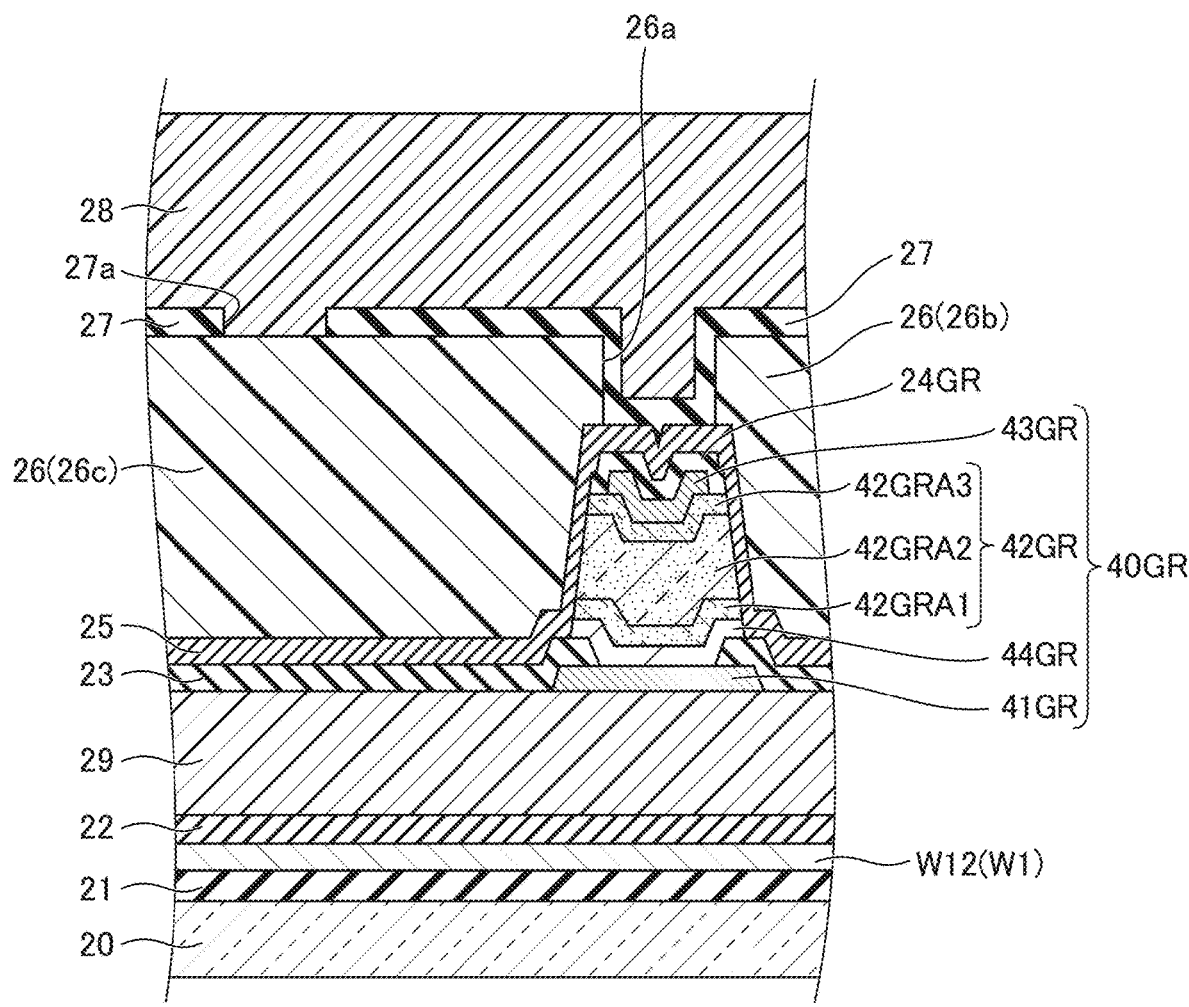
FIG. 13 is a cross-sectional view schematically representing a configuration of components around a guard ring in the photoelectric conversion device according to Modification 3 of the embodiment shown in FIG. 12.

FIG. 13 is a cross-sectional view schematically representing a configuration of components around a guard ring 40GR in the photoelectric conversion device 10 according to Modification 3 of the embodiment shown in FIG. 12. As shown in FIG. 13, in the photoelectric conversion device 10 according to Modification 3, the guard ring 40GR has a third layer 44GR provided between the first layer 41GR and the intermediate layer 42GR.

The third layer 44GR is provided over the first layer 41GR and over the second insulating layer 23 over the ends of the first layer 41GR, and the first intermediate layer 42GRA1 of the intermediate layer 42GR is provided over the third layer 44GR. The third layer 44GR contains the same electrical conducting material as the intermediate electrically-conductive layer 44 (see FIG. 12). That is, the third layer 44GR is formed at the same layer in the same step using the same material as the intermediate electrically-conductive layer 44.

The guard ring 40GR shown in FIG. 13 can be made greater in film thickness than in a case where the intermediate electrically-conductive layer 44 is not provided. The guard ring 40GR thus made greater in film thickness makes it possible to more planarize irregularities on a surface of the sixth insulating layer 27 formed by the groove portion 26a. This makes it possible to inhibit the scintillation light from being diffusely reflected due to the irregularities, resulting in making it possible to obtain a photoelectric conversion device 10 that gives a higher-definition X-ray image.

It should be noted that elements having appeared in the aforementioned embodiment or modifications may be appropriately combined unless a contradiction arises.

What is claimed is:

1. A photoelectric conversion device comprising:
    a photoelectric conversion area in which photoelectric conversion elements each including a first electrode, a second electrode, and a photoelectric conversion layer, provided between the first electrode and the second electrode, that contains a semiconductor material are provided in a matrix; and
    a guard ring surrounding a periphery of the photoelectric conversion area in a form of a frame,
    wherein the guard ring has an intermediate layer containing the same semiconductor material as the photoelectric conversion layer.

2. The photoelectric conversion device according to claim 1, wherein the guard ring has at least one electrically-conductive layer, stacked at a lower layer or a higher layer than the intermediate layer, that contains the same electrical conducting material as at least either the first electrode or the second electrode.

3. The photoelectric conversion device according to claim 2, wherein
    the at least one electrically-conductive layer comprises a plurality of electrically-conductive layers,
    the plurality of electrically-conductive layers includes a first layer containing the same electrical conducting material as the first electrode and a second layer containing the same electrical conducting material as the second electrode, and
    the intermediate layer is provided between the first layer and the second layer.

4. The photoelectric conversion device according to claim 1, wherein
    the photoelectric conversion layer is a structure in which an n-type semiconductor layer, an i-type semiconductor layer, and a p-type semiconductor layer are stacked, and
    the intermediate layer of the guard ring is a structure in which a first intermediate layer containing the same semiconductor material as the n-type semiconductor layer, a second intermediate layer containing the same semiconductor material as the i-type semiconductor layer, and a third intermediate layer containing the same semiconductor material as the p-type semiconductor layer are stacked.

5. The photoelectric conversion device according to claim 1, further comprising:
    a thin-film transistor (TFT) provided in the photoelectric conversion area and electrically connected to a corresponding one of the photoelectric conversion elements; and
    a wire formed using a material that is identical to a metal layer forming the TFT,
    wherein the wire extends from a first end to a second end in such a way as to cross the guard ring.

6. The photoelectric conversion device according to claim 1, further comprising:
    thin-film transistors (TFTs), provided in the matrix in the photoelectric conversion area, each of which has a drain electrode, a source electrode, and a gate electrode; and
    a resin insulating layer covering the TFTs and having a surface provided with the first electrode,
    wherein the first electrode is connected to at least either the drain electrode or the source electrode via a contact hole formed in the resin insulating layer.

7. The photoelectric conversion device according to claim 5, further comprising a resin insulating layer, provided at a crossing of the guard ring and the wire and between the guard ring and the wire, that contains an insulative resin material.

8. The photoelectric conversion device according to claim 1, further comprising an intermediate electrically-conductive layer provided over the first electrode and between the first electrode and the photoelectric conversion layer.

9. An X-ray imaging device comprising:
the photoelectric conversion device according to claim 1; and
a scintillator, provided over the photoelectric conversion device, that emits light according to X-rays falling thereon.

* * * * *